(12) United States Patent
Nakayama et al.

(10) Patent No.: US 10,761,222 B2
(45) Date of Patent: Sep. 1, 2020

(54) DETECTION ELEMENT AND DETECTOR

(71) Applicant: Kabushiki Kaisha Toshiba, Minato-ku (JP)

(72) Inventors: Kohei Nakayama, Kawasaki (JP);
Fumihiko Aiga, Kawasaki (JP); Go Kawata, Nagareyama (JP); Isao Takasu, Setagaya (JP); Yuko Nomura, Kawasaki (JP); Satomi Taguchi, Ota (JP); Hyangmi Jung, Yokohama (JP); Atsushi Wada, Kawasaki (JP); Rei Hasegawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 45 days.

(21) Appl. No.: 16/121,754

(22) Filed: Sep. 5, 2018

(65) Prior Publication Data

US 2019/0265370 A1   Aug. 29, 2019

(30) Foreign Application Priority Data

Feb. 23, 2018   (JP) .................................. 2018-031188

(51) Int. Cl.
*G01T 1/24* (2006.01)
*H01L 27/30* (2006.01)
*H01L 51/44* (2006.01)
*H01L 51/42* (2006.01)

(52) U.S. Cl.
CPC ............ *G01T 1/241* (2013.01); *H01L 27/301* (2013.01); *H01L 51/444* (2013.01); *G01T 1/242* (2013.01); *H01L 51/4206* (2013.01)

(58) Field of Classification Search
None
See application file for complete search history.

(56) References Cited

U.S. PATENT DOCUMENTS

| 5,418,379 A * | 5/1995 | Parsons ..................... G21F 5/02 250/497.1 |
| 6,175,120 B1 | 1/2001 | McGregor et al. |

(Continued)

FOREIGN PATENT DOCUMENTS

| JP | 2009-032983 A | 2/2009 |
| JP | 2012-015434 | 1/2012 |

(Continued)

OTHER PUBLICATIONS

Tamura. M. et al. "Beta particle detection efficiency of the radiation sensor made from a mixture of polyaniline and titanium oxide", Nuclear Instruments and methods in Physics Research A, 2016, 5 pages.

(Continued)

*Primary Examiner* — Andrew Smyth
(74) *Attorney, Agent, or Firm* — Oblon, McClelland, Maier & Neustadt, L.L.P.

(57) ABSTRACT

According to an embodiment, a detection element includes a first electrode, a second electrode, an organic conversion layer, and a third electrode. A bias is applied to the first electrode. The organic conversion layer is arranged between the first electrode and the second electrode, and is configured to convert energy of a radiation into an electric charge. The third electrode is arranged in the organic conversion layer.

11 Claims, 5 Drawing Sheets

(56) References Cited

U.S. PATENT DOCUMENTS

| | | | |
|---|---|---|---|
| 8,270,567 B2* | 9/2012 | Yamamoto | H01J 31/28 378/62 |
| 2004/0021088 A1 | 2/2004 | Thers et al. | |
| 2005/0205903 A1* | 9/2005 | Hioki | H01L 51/4253 257/291 |
| 2009/0256140 A1 | 10/2009 | Meng et al. | |
| 2010/0128845 A1* | 5/2010 | Yamamoto | H01L 27/14676 378/62 |
| 2014/0225094 A1 | 8/2014 | Fraboni et al. | |
| 2015/0221706 A1* | 8/2015 | Udaka | H01L 27/3234 257/40 |

FOREIGN PATENT DOCUMENTS

| | | |
|---|---|---|
| JP | 2013-089685 | 5/2013 |
| JP | 2014-529728 | 11/2014 |
| KR | 10-2017-0029363 A | 3/2017 |

OTHER PUBLICATIONS

Office Action dated Jan. 10, 2020, in co-pending U.S. Appl. No. 16/123,332, citing documents AA, AB, and AC, therein, 72 pages.

* cited by examiner

DETECTION ELEMENT AND DETECTOR

CROSS-REFERENCE TO RELATED APPLICATIONS

This application is based upon and claims the benefit of priority from Japanese Patent Application No. 2018-031188, filed on Feb. 23, 2018; the entire contents of which are incorporated herein by reference.

FIELD

Embodiments described herein relate generally to a detection element and a detector.

BACKGROUND

There is known a detection element using an organic conversion layer of organic material as a semiconductor layer that converts a radiation into an electric charge. The detection element detects a radiation by detecting an output signal corresponding to an electron-hole pair generated by a radiation that has entered the organic conversion layer. In such a detection element, known is a configuration in which a thickness of an organic semiconductor layer is increased to improve detection sensitivity for a radiation other than a gamma ray.

However, as the thickness of the organic conversion layer increases, a hole generated in the organic semiconductor layer tends to lose energy before reaching an electrode, and get buried in thermal fluctuation and disappear. It follows that only an electron having high energy reaches the electrode from which an output signal is taken out. As a result, the output signal includes not only dependency on the number of electron-hole pairs but also position dependency related to a generation position of the electron-hole pair in the organic semiconductor layer. Thus, in the related art, detection sensitivity is lowered in some cases.

DETAILED DESCRIPTION

According to an embodiment, a detection element includes a first electrode, a second electrode, an organic conversion layer, and a third electrode. A bias is applied to the first electrode. The organic conversion layer is arranged between the first electrode and the second electrode, and is configured to convert energy of a radiation into an electric charge. The third electrode is arranged in the organic conversion layer.

The following describes embodiments in detail with reference to the attached drawings.

First Embodiment

Figure 1:
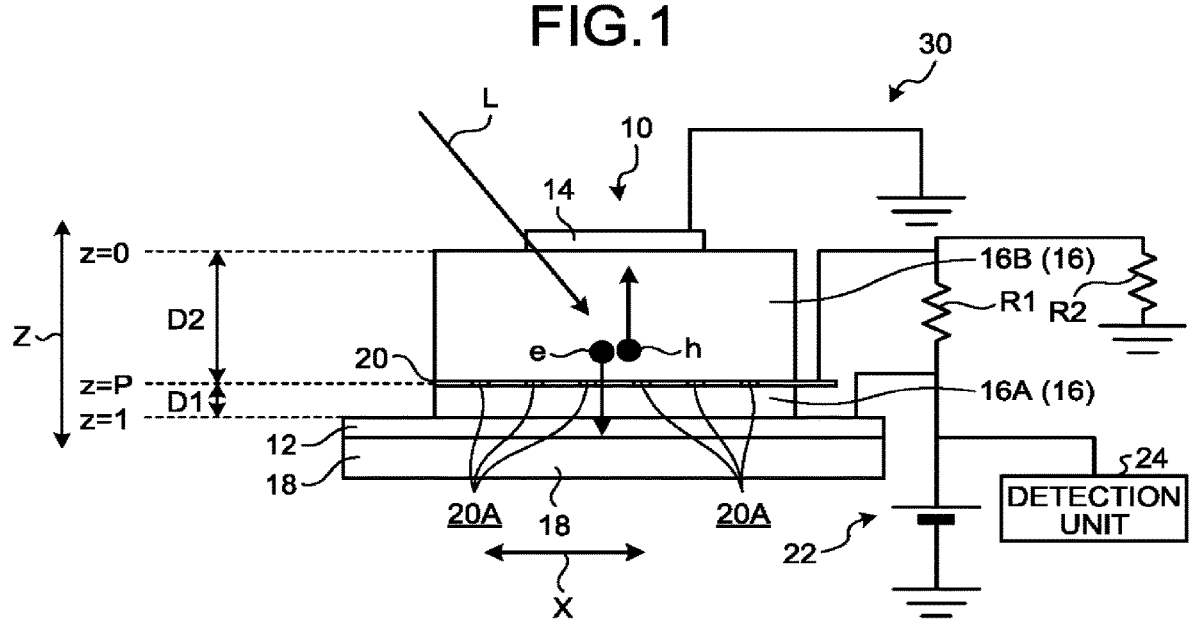
FIG. 1 is a schematic diagram illustrating an example of a detector.

FIG. 1 is a schematic diagram illustrating an example of a detector 30 according to the present embodiment.

The detector 30 includes a detection element 10, a voltage application unit 22, and a detection unit 24. The detection element 10, the voltage application unit 22, and the detection unit 24 are electrically connected to each other.

First, the following describes the detection element 10. The detection element 10 includes a substrate 18, a first electrode 12, a second electrode 14, an organic conversion layer 16, and a third electrode 20.

In the present embodiment, the detection element 10 is a laminate obtained by laminating the first electrode 12, the organic conversion layer 16, and the second electrode 14 on the substrate 18 in this order. That is, the organic conversion layer 16 is arranged between the first electrode 12 and the second electrode 14. The third electrode 20 is arranged in the organic conversion layer 16 (details will be described later).

The first electrode 12 is an electrode to which a bias is applied. The first electrode 12 is arranged on a downstream side in an incident direction of a radiation L with respect to the organic conversion layer 16. In the present embodiment, the first electrode 12 is arranged being in contact with the organic conversion layer 16 on the downstream side in the incident direction of the radiation L as compared with the organic conversion layer 16. In the present embodiment, the radiation L enters in a direction toward the first electrode 12 from the second electrode 14 in the detection element 10. A layer that does not influence an electric field between the first electrode 12 and the second electrode 14 (for example, a bonding layer) may be arranged between the first electrode 12 and the organic conversion layer 16.

The first electrode 12 is electrically connected to the voltage application unit 22 and the detection unit 24. The voltage application unit 22 applies a bias to the first electrode 12. The detection unit 24 detects an output signal output from the first electrode 12.

A component material of the first electrode 12 may be a material having electrical conductivity, and is not limited. The first electrode 12 is, for example, indium tin oxide (ITO), graphene, ZnO, aluminum, and gold. The thickness of the first electrode 12 is not limited.

The second electrode 14 is arranged on an upstream side in the incident direction of the radiation L with respect to the organic conversion layer 16. In the present embodiment, the second electrode 14 is arranged being in contact with the organic conversion layer 16 on an upstream side in the incident direction of the radiation L as compared with the organic conversion layer 16. A layer (for example, a bonding layer) may be arranged between the second electrode 14 and the organic conversion layer 16, the layer not influencing the electric field between the first electrode 12 and the second electrode 14, and not inhibiting transmission of the radiation L as a detection target.

The second electrode 14 is grounded. The second electrode 14 may be electrically connected to the voltage application unit 22.

The second electrode 14 has electrical conductivity. A component material of the second electrode 14 may be a material that has electrical conductivity and transmits the radiation L as a detection target that enters the second electrode 14. "Transmits the radiation L" means to transmit 50% or more of the entered radiation L, preferably 80% or more thereof. The second electrode 14 is made of, for example, ITO, graphene, ZnO, aluminum, and gold. The thickness of the second electrode 14 is not limited.

The organic conversion layer 16 is an organic semiconductor layer that converts energy of the radiation L into an electric charge. The organic conversion layer 16 is arranged between the first electrode 12 and the second electrode 14.

The type of the radiation L converted into an electric charge by the organic conversion layer 16 is, for example, at least one of a β-ray, a heavy particle beam, an α-ray, a neutron ray, and a γ-ray. In the present embodiment, the organic conversion layer 16 is preferably configured to convert energy of at least one of the β-ray, the α-ray, and the neutron ray into an electric charge, and is especially preferably configured to convert at least the energy of the β-ray into an electric charge.

The organic conversion layer 16 may have a material configuration containing, as a principal component, an organic material used for a known organic semiconductor. "Containing, as a principal component" means that a content rate is equal to or larger than 70%.

For example, an organic material used for the organic conversion layer 16 is selected from at least one of a derivative of polyphenylene vinylene (PPV) and polythiophene-based polymeric material.

The derivative of polyphenylene vinylene is, for example, poly [2-methoxy, 5-(2'-ethyl-hexyloxy)-p-phenylene-vinylene] (MEH-PPV). The polythiophene-based polymeric material is, for example, poly (3-alkylthiophene) such as poly-3-hexylthiophene (P3HT), and dioctylfluorene-bithiophene copolymer (F8T2). Especially preferably, P3HT and F8T2 may be used for the organic conversion layer 16.

The organic conversion layer 16 may be a mixture of an organic material and an inorganic material. In this case, for example, the organic conversion layer 16 may be a mixture of the organic material, and fullerene, a fullerene derivative, a carbon nanotube (CNT) having semiconductor property, a CNT compound, and the like.

The fullerene derivative is, for example, [6,6]-phenyl-C61-methyl butyrate (PCBM), a dimer of fullerene, and a fullerene compound introducing alkali metal, alkaline-earth metal, and the like. The CNT is, for example, a carbon nanotube containing fullerene or metal-containing fullerene. The CNT is, for example, a CNT compound obtained by adding various molecules to a side wall or a distal end of the CNT.

The thickness of the organic conversion layer 16 is not limited. A thickness direction (arrow Z-direction) of the organic conversion layer 16 is identical to a direction in which the first electrode 12 and the second electrode 14 face each other.

The detection element 10 according to the present embodiment preferably prevents the γ-ray from being detected, and detects the radiation L other than the γ-ray (the β-ray, the α-ray, the neutron ray, and the like). Thus, the organic conversion layer 16 preferably has a thickness sufficient for selectively transmitting the γ-ray, and for selectively converting energy of the radiation L other than the γ-ray (for example, the β-ray, the α-ray, and the neutron ray) into an electric charge.

By causing the organic conversion layer 16 to have the sufficient thickness described above, the number of electron-hole pairs generated by the radiation other than the γ-ray (for example, the β-ray, the α-ray, and the neutron ray) can be increased. Thus, with the sufficient thickness described above, the organic conversion layer 16 can be configured to be able to selectively convert energy of the radiation L other than the γ-ray (for example, the β-ray, the α-ray, and the neutron ray) into an electric charge.

Next, the following describes the third electrode 20. The third electrode 20 is arranged in the organic conversion layer 16. In the present embodiment, the third electrode 20 is connected to the voltage application unit 22 via a resistor R1. The third electrode 20 may be connected to voltage application unit that can apply voltage different from that of the voltage application unit 22, or may be grounded.

The third electrode 20 is a sheet-like electrode.

Hereinafter, the thickness direction (arrow Z-direction) of the organic conversion layer 16 is referred to as a thickness direction Z in some cases. Hereinafter, a direction orthogonal to the thickness direction Z (arrow X-direction) is referred to as a plane direction X in some cases.

A position of the third electrode 20 in the thickness direction Z of the organic conversion layer 16 is not limited.

However, the third electrode 20 is preferably arranged on a side closer to the first electrode 12 than the center of the thickness direction Z of the organic conversion layer 16. That is, a first distance D1 between the first electrode 12 and the third electrode 20 is preferably smaller than a second distance D2 between the second electrode 14 and the third electrode 20.

The first distance D1 is a distance between the first electrode 12 and the third electrode 20.

The second distance D2 is a distance between the second electrode 14 and the third electrode 20.

The position and the range of the third electrode 20 in the plane direction X of the organic conversion layer 16 are not limited. The third electrode 20 is preferably formed in a sheet-like shape arranged over the entire region in the plane direction X in the organic conversion layer 16. The third electrode 20 may have a sheet-like shape occupying partial region in the plane direction X in the organic conversion layer 16. The third electrode 20 may have a configuration including a plurality of regions the positions of which are the same in the thickness direction Z of the organic conversion layer 16 and the positions of which are different in the plane direction X.

The third electrode 20 preferably has one or a plurality of through holes 20A passing therethrough in the thickness direction Z of the organic conversion layer 16.

If the third electrode 20 has the through hole 20A, the organic conversion layer 16 can be prevented from converting the energy of the γ-ray into an electric charge. Thus, the organic conversion layer 16 can selectively convert the energy of the radiation L other than the γ-ray (the β-ray, the α-ray, the neutron ray, and the like) into an electric charge. This may be because the γ-ray included in the radiation L that has entered the organic conversion layer 16 impinges against the third electrode 20 and is not transmitted through the organic conversion layer 16, and the γ-ray can be prevented from being converted into an electric charge by the organic conversion layer 16.

In a case in which the third electrode 20 includes a plurality of through holes 20A, the through holes 20A having the same size are preferably uniformly arranged along the plane direction X at constant intervals. That is, the third electrode 20 is preferably configured as a mesh-like sheet with the through holes 20A. The shape of the through hole 20A is not limited. For example, the shape of the through hole 20A may be any of a circular shape and a rectangular shape.

The component material of the third electrode 20 may be a material that has electrical conductivity and transmits the radiation L entering the third electrode 20.

The third electrode 20 is preferably formed from a conductive carbon material. By forming the third electrode 20 from a conductive carbon material, the organic conversion layer 16 can be prevented from converting the energy of the γ-ray into an electric charge.

For example, the third electrode 20 may be formed from at least one of a carbon fiber, carbon paper, a porosity carbon sheet, an activated carbon sheet, and graphene.

The substrate 18 may be a member that can support constituent parts other than the substrate 18 in the detection element 10. The substrate 18 is, for example, a silicon substrate, but is not limited thereto.

Next, the following describes the voltage application unit 22. The voltage application unit 22 applies a bias to the first electrode 12. In the present embodiment, the voltage application unit 22 applies a bias to the first electrode 12, and applies voltage to the third electrode 20 via the resistor R1 and the third electrode 20 is connected to the ground via the resister R2. The potential value of the third electrode 20 is adjusted by the value of the resistors (R1, R2).

Thus, voltage equal to or lower than the voltage applied to the first electrode 12 is applied to the third electrode 20. A first potential difference between the first electrode 12 and the third electrode 20 is preferably larger than a second potential difference between the second electrode 14 and the third electrode 20. Such a potential difference can be implemented by adjusting a voltage value of the voltage applied to at least one of the first electrode 12, the third electrode 20, and the second electrode 14.

In the present embodiment, the second electrode 14 is grounded. The third electrode 20 is connected to the voltage application unit 22 via the resistor R1. The first electrode 12 is connected to the voltage application unit 22. Thus, by applying the voltage to the first electrode 12, and the third electrode 20 via the resistor R1 from the voltage application unit 22, the first potential difference between the first electrode 12 and the third electrode 20 can be caused to be larger than the second potential difference between the second electrode 14 and the third electrode 20.

The detection unit 24 detects an output signal output from the first electrode 12. The output signal is a signal indicating a charge amount converted by the organic conversion layer 16. In other words, the output signal is detection energy of the radiation L detected by the organic conversion layer 16. The detection unit 24 converts an amount of charges detected by the organic conversion layer 16 into a signal that can be measured by a charge amplifier and the like to be an output signal. In the present embodiment, for simplifying the description, the detection unit 24 is assumed to receive the output signal from the first electrode 12.

The detection unit 24 derives the detection energy of the radiation L based on the output signal received from the first electrode 12. To derive the detection energy, a known method may be used.

Method of Manufacturing Detector 30

Next, the following describes a method of manufacturing the detector 30. The method of manufacturing the detector 30 is not limited. For example, the detector 30 is manufactured through the following procedure.

First, the detection element 10 is manufactured. The first electrode 12 is laminated on the substrate 18, and a thin organic conversion layer 16A, the third electrode 20, an organic conversion layer 16B thicker than the organic conversion layer 16A, and the second electrode 14 are laminated on the first electrode 12 in this order. The organic conversion layer 16A and the organic conversion layer 16B are part of the organic conversion layer 16. The organic conversion layer 16A represents a layer between the first electrode 12 and the third electrode 20 in the organic conversion layer 16. The organic conversion layer 16B represents a layer between the third electrode 20 and the second electrode 14 in the organic conversion layer 16.

As a method of laminating the first electrode 12, the organic conversion layer 16 (the organic conversion layer 16A, the organic conversion layer 16B), the third electrode 20, and the second electrode 14, a known deposition method or a known manufacturing method may be used.

The first electrode 12 is electrically connected to the voltage application unit 22 and the detection unit 24. The third electrode 20 is electrically connected to the voltage application unit 22 via the resistor R1 and the ground via the resister R2. The second electrode 14 is grounded. The detector 30 is manufactured through the above procedures.

Effect of Detection Element 10

Next, the following describes an effect of the detection element 10.

The radiation L enters the detection element 10, and reaches the organic conversion layer 16. Due to the radiation L that has reached the organic conversion layer 16, an electron-hole pair of an electron e and a hole h is generated in the organic conversion layer 16. Specifically, the electron-hole pair is generated at various positions in the thickness direction Z and the plane direction X of the organic conversion layer 16 in the organic conversion layer 16. The hole h of the generated electron-hole pair moves toward the second electrode 14 side, and the electron e moves toward the first electrode 12 side.

In the present embodiment, the third electrode 20 is arranged in the organic conversion layer 16. Thus, an electric field between the first electrode 12 to which a bias is applied and the third electrode 20 is higher than an electric field between the second electrode 14 and the third electrode 20 in the organic conversion layer 16.

Figure 2:
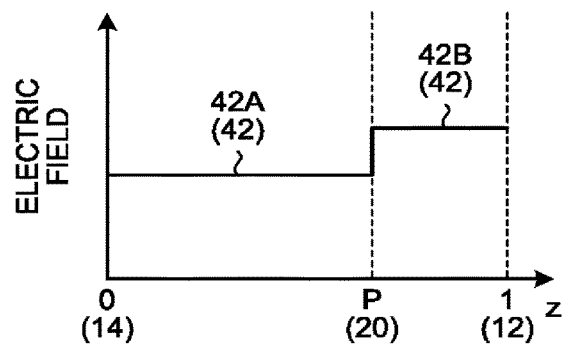
FIG. 2 is a diagram illustrating an electric field of a detection element.

FIG. 2 is a diagram illustrating an example of the electric field of the detection element 10. An end on the second electrode 14 side of the organic conversion layer 16 (that is, a position of a plane of incidence S) is represented as a position in the thickness direction Z, that is, z=0 (also refer to FIG. 1). An end face on the first electrode 12 side of the organic conversion layer 16 (a position of an end face N) is represented as a position in the thickness direction Z, that is, z=1. A position of the third electrode 20 in the thickness direction Z of the organic conversion layer 16 is represented as a position z=P. However, the position z=P represents a relation of 0<P<1. In the drawings described later, "z" also has the same meaning.

As illustrated in FIG. 2, an electric field 42B between the third electrode 20 and the first electrode 12 is higher than an electric field 42A between the second electrode 14 and the third electrode 20.

Figure 3:
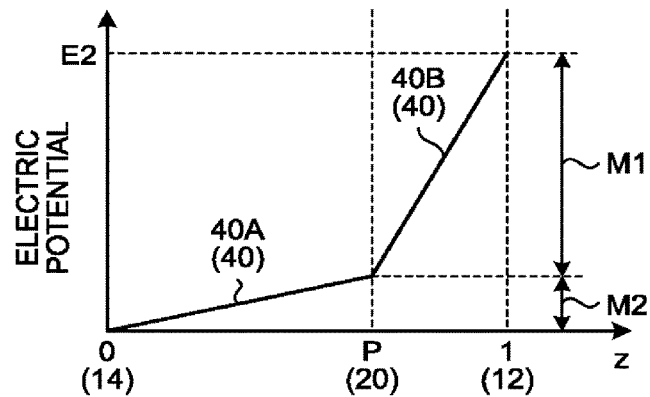
FIG. 3 is a diagram illustrating electric potential of the detection element.

Accordingly, electric potential among the first electrode 12, the third electrode 20, and the second electrode 14 becomes electric potential illustrated in FIG. 3. FIG. 3 is a diagram illustrating an example of the electric potential of the detection element 10. As illustrated in FIG. 3, a first potential difference M1 between the first electrode 12 and the third electrode 20 is larger than a second potential difference M2 between the second electrode 14 and the third electrode 20. Inclination of a line 40B representing the electric potential between the third electrode 20 and the first electrode 12 is larger than inclination of a line 40A representing the electric potential between the first electrode 12 and the third electrode 20. The inclination of these lines 40 (the line 40A, the line 40B) corresponds to the potential difference per unit distance in the thickness direction Z in the organic conversion layer 16.

The electrons generated in the organic semiconductor layer 16 can move longer than the holes generated in the organic semiconductor layer 16. Due to the difference of the travel distance, the output signal from the first electrode 12 contains the effect of the position of the hole electron pairs generated by the radiation L unfortunately.

The intensity of the output signal is proportional to the amount of charge moving through the organic semiconductor layer 16 and the electric field.

In order to exclude the effect of the hole-electron pairs generated position, the area mainly for detecting a signal from moving charges 16A is separated from the area mainly for generating hole-electron pairs 16B.

And the area mainly for detecting a signal from moving charges 16A is smaller volume and higher electric field than the area mainly for generating hole-electron pairs 16B.

Accordingly, in the detection element 10 according to the present embodiment, the output signal more accurately representing the number of electron-hole pairs generated in the organic conversion layer 16 is output from the first electrode 12, and detection sensitivity for the radiation L can be improved.

Thus, in the detection element 10 according to the present embodiment, The output signal from the first electrode 12 can be independent of the generated position of the electron-hole pairs in the thickness direction Z of the organic conversion layer 16.

Figure 4:
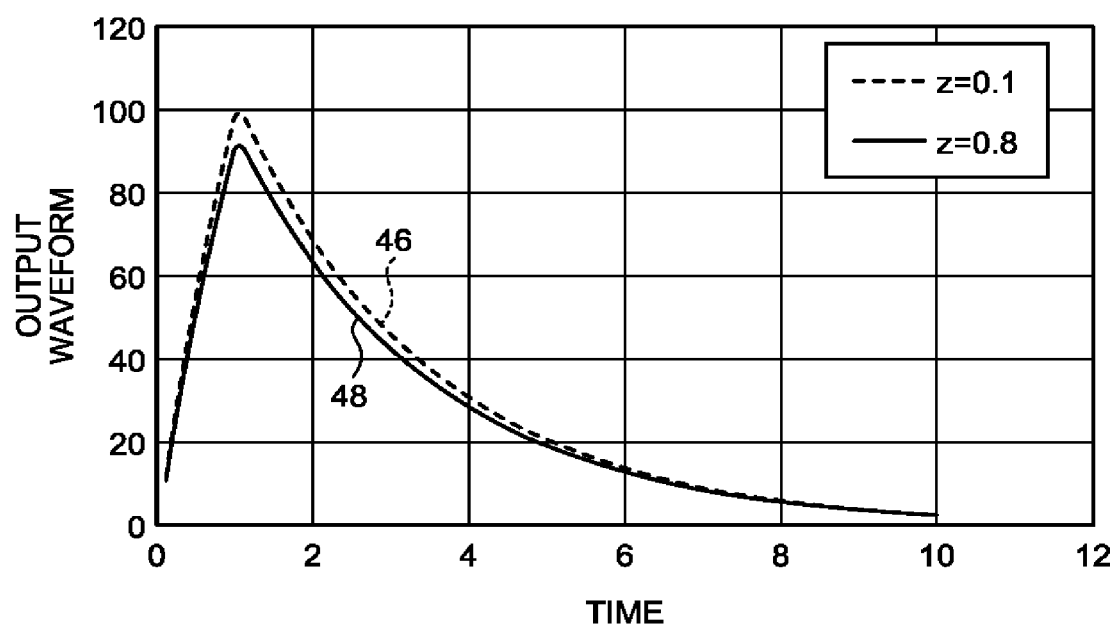
FIG. 4 is a diagram illustrating an output waveform with respect to a generation position of an electron-hole pair.

FIG. 4 is a diagram illustrating an example of an output waveform with respect to a generation position of the electron-hole pair in the organic conversion layer 16 according to the present embodiment. FIG. 4 illustrates an output waveform 48 in a case in which the generation position of 100 electron-hole pairs is z=0.8, which is close to the first electrode 12 side in the thickness direction Z of the organic conversion layer 16. FIG. 4 also illustrates an output waveform 46 in a case in which the generation position of 100 electron-hole pairs is z=0.1, which is close to the second electrode 14 in the thickness direction of the organic conversion layer 16. The output waveform is a waveform represented by the output signal.

As illustrated in FIG. 4, in the organic conversion layer 16 according to the present embodiment, it can be said that the position dependency on the output signal from the first electrode 12 is suppressed, the position dependency related to the generation position of the electron-hole pair in the thickness direction Z of the organic conversion layer 16.

On the other hand, in a conventional detection element not including the third electrode 20, the position dependency on the output signal from the first electrode 12 has been hard to be suppressed, the position dependency related to the generation position of the electron-hole pair in the thickness direction Z of the organic conversion layer 16.

Figure 5:
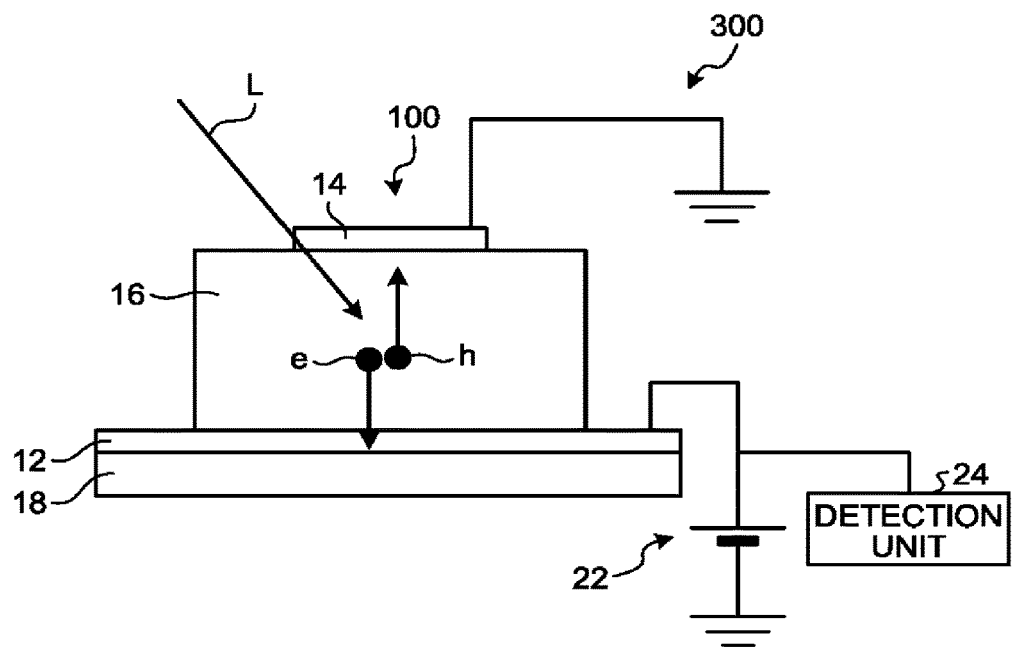
FIG. 5 is a schematic diagram of a comparative detector.

FIG. 5 is a schematic diagram illustrating an example of a comparative detector 300. The comparative detector 300 is a conventional detector.

The comparative detector 300 includes a comparative detection element 100, the voltage application unit 22, and the detection unit 24. The functions of the voltage application unit 22 and the detection unit 24 are the same as that of the detector 30 according to the present embodiment.

The comparative detection element 100 is a conventional detection element. The comparative detection element 100 includes the substrate 18, the first electrode 12, the organic conversion layer 16, and the second electrode 14. The comparative detection element 100 has the same configuration as that of the detection element 10 except that the third electrode 20 according to the present embodiment is not included therein.

Figure 6:
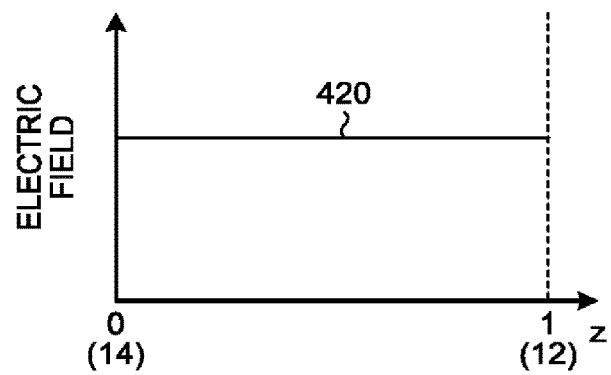
FIG. 6 is a diagram illustrating an electric field of a comparative detection element.

FIG. 6 is a diagram illustrating an example of an electric field of the comparative detection element 100. In a case of not including the third electrode 20, the electric field between the second electrode 14 and the first electrode 12 in the organic conversion layer 16 is substantially constant.

Figure 7:
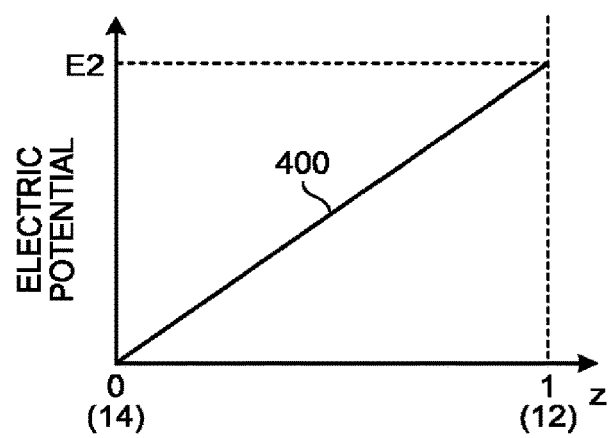
FIG. 7 is a diagram illustrating electric potential of the comparative detection element.

Thus, the electric potential in the organic conversion layer 16 of the comparative detection element 100 becomes electric potential illustrated in FIG. 7. FIG. 7 is a diagram illustrating an example of the electric potential of the comparative detection element 100. As illustrated in FIG. 7, inclination of a line 400 representing the electric potential between the first electrode 12 and the second electrode 14 becomes substantially constant.

Thus, in the conventional comparative detection element 100, the hole h is hard to be prevented from losing energy and disappearing before reaching the second electrode 14.

To prevent the γ-ray from being detected and improve detection sensitivity for the radiation L other than the γ-ray (for example, the β-ray), it is assumed that the organic conversion layer 16 of the comparative detection element 100 has the sufficient thickness as described above. In this case, the number of electron-hole pairs generated by the radiation other than the γ-ray (for example, the β-ray) can be increased. However, in the conventional comparative detection element 100, as the thickness of the organic conversion layer 16 is larger, the number of holes h that lose energy and disappear before reaching the second electrode 14 is increased. Thus, in the conventional comparative detection element 100, as the thickness of the organic conversion layer 16 increases, the position dependency on the output signal is increased, the position dependency related to the generation position of the electron-hole pair in the thickness direction Z of the organic conversion layer 16.

Figure 8:
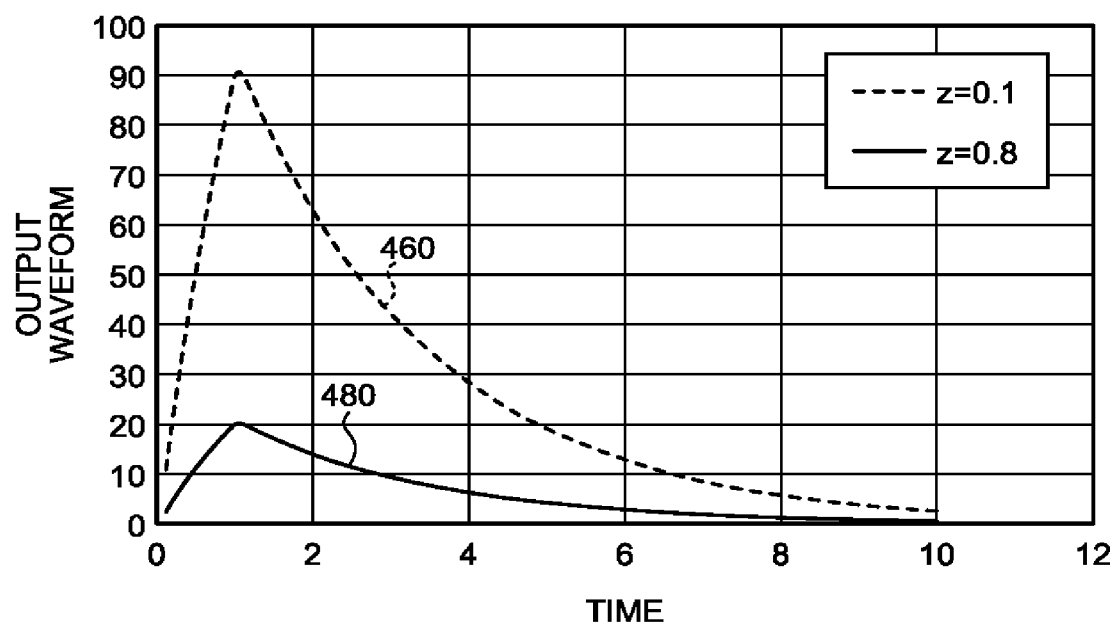
FIG. 8 is a diagram illustrating an output waveform of the comparative detection element.

FIG. 8 is a diagram illustrating an example of the output waveform with respect to the generation position of the electron-hole pair in the conventional comparative detection element 100. FIG. 8 illustrates an output waveform 480 in a case in which the generation position of 100 electron-hole pairs is z=0.8, which is close to the first electrode 12 side in the thickness direction Z of the organic conversion layer 16. FIG. 8 also illustrates an output waveform 460 in a case in which the generation position of 100 electron-hole pairs is z=0.1, which is close to the second electrode 14 in the thickness direction of the organic conversion layer 16.

As illustrated in FIG. 8, it can be seen that, in the conventional comparative detection element 100, the position dependency on the output signal output from the first electrode 12 is large, the position dependency related to the generation position of the electron-hole pair in the thickness direction Z of the organic conversion layer 16. On the other hand, as described above with reference FIG. 4, the detection element 10 according to the present embodiment can prevent the position dependency related to the generation position of the electron-hole pair in the thickness direction Z-direction of the organic conversion layer 16.

As described above, the detection element 10 according to the present embodiment includes the first electrode 12, the second electrode 14, the organic conversion layer 16, and the third electrode 20. A bias is applied to the first electrode 12. The organic conversion layer 16 is arranged between the first electrode 12 and the second electrode 14, and converts the energy of the radiation L into an electric charge. The third electrode 20 is arranged in the organic conversion layer 16.

Thus, in the detection element 10 according to the present embodiment, the output signal from the first electrode 12 can be prevented from including the position dependency related to the generation position of the electron-hole pair in the thickness direction Z of the organic conversion layer 16. Accordingly, in the detection element 10 according to the present embodiment, the output signal representing the number of electron-hole pairs generated in the organic conversion layer 16 more accurately than that in the comparative detection element 100 is output from the first electrode 12.

Thus, with the detection element 10 according to the present embodiment, detection sensitivity for the radiation L can be improved.

Second Embodiment

In the present embodiment, described is a configuration in which an electrode is further provided in the organic conversion layer 16.

Figure 9:
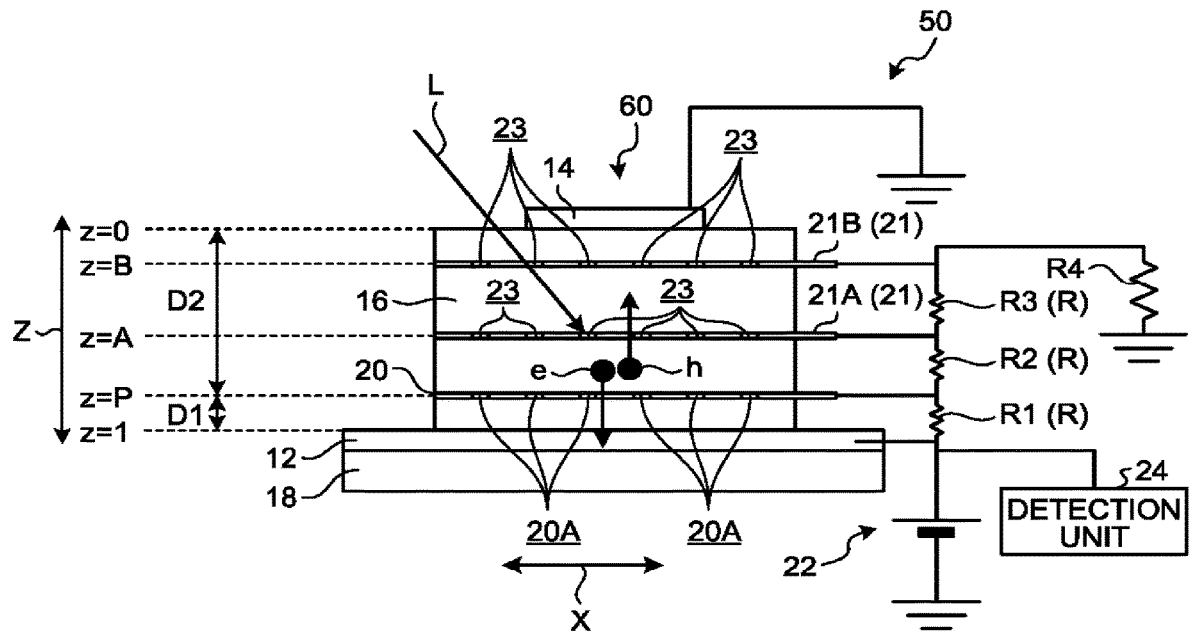
FIG. 9 is a schematic diagram illustrating a detector.

FIG. 9 is a schematic diagram illustrating an example of a detector 50 according to the present embodiment. The same functional constituent as that in the detector 50 according to the first embodiment is denoted by the same reference numeral, and redundant description will not be repeated.

The detector 50 includes a detection element 60, the voltage application unit 22, and the detection unit 24. The detection element 60, the voltage application unit 22, and the detection unit 24 are electrically connected to each other. The voltage application unit 22 and the detection unit 24 are the same as those in the first embodiment.

The detection element 60 includes the substrate 18, the first electrode 12, the second electrode 14, the organic conversion layer 16, the third electrode 20, and a fourth electrode 21. The substrate 18, the first electrode 12, the second electrode 14, the organic conversion layer 16, and the third electrode 20 are the same as those in the first embodiment. That is, the detection element 60 according to the present embodiment is configured by further adding the fourth electrode 21 to the detection element 10 according to the first embodiment.

The fourth electrode 21 is arranged between the third electrode 20 and the second electrode 14 in the organic conversion layer 16. Between the third electrode 20 and the second electrode 14, one fourth electrode 21 may be arranged, or a plurality of fourth electrodes 21 may be arranged, the fourth electrodes 21 the positions of which are different from each other in the thickness direction Z of the organic conversion layer 16.

In the present embodiment, described is a form in which two fourth electrodes 21 including a fourth electrode 21A and a fourth electrode 21B (the fourth electrode 21A, the fourth electrode 21B) are arranged between the third electrode 20 and the second electrode 14, by way of example. The positions of the fourth electrode 21A and the fourth electrode 21B in the thickness direction Z are different from each other. The fourth electrode 21A is arranged on a side closer to the third electrode 20 than the fourth electrode 21B. The fourth electrode 21B is arranged on a side closer to the second electrode 14 than the fourth electrode 21A. Three or more fourth electrodes 21 may be arranged between the third electrode 20 and the second electrode 14.

In the present embodiment, the fourth electrode 21 is electrically connected to the voltage application unit 22 via a resistor R. Specifically, the fourth electrode 21A is connected to the voltage application unit 22 via a resistor R2 and the resistor R1. The fourth electrode 21B is connected to the voltage application unit 22 via a resistor R3, the resistor R2, and the resistor R1 and the fourth electrode 21B is connected to the ground via the resister R4. Each potential of the fourth electrodes 21 is adjusted by the value of the resistors (R1, R2, R3, R4).

The fourth electrode 21 is a sheet-like electrode along the plane of incidence S of the radiation L in the organic conversion layer 16. The position of the fourth electrode 21 in the thickness direction Z is not limited between the second electrode 14 and the third electrode 20 in the organic conversion layer 16. In a case of configuration in which the fourth electrodes 21 are arranged in the organic conversion layer 16, intervals among the fourth electrodes 21 are not limited.

At least one of the fourth electrodes 21 may be arranged to occupy part of the plane direction X in the organic conversion layer 16. In other words, at least one of a plurality of first electrodes 12 may be arranged over the entire region in the plane direction X in the organic conversion layer 16.

Similarly to the third electrode 20, the fourth electrode 21 preferably includes one or a plurality of through holes 23 passing therethrough in the thickness direction Z of the organic conversion layer 16. That is, the fourth electrode 21 is preferably configured as a mesh-like sheet with the through holes 23. The shape of the through hole 23 is not limited.

Similarly to the third electrode 20, the component material of the fourth electrode 21 may be a material that has electrical conductivity and transmits the radiation L entering the fourth electrode 21. Similarly to the third electrode 20, the fourth electrode 21 is preferably formed from a conductive carbon material.

The first potential difference between the fourth electrode 21 and the third electrode 20 is preferably larger than a third potential difference, fourth potential difference, and a fifth potential difference.

The third potential difference is a potential difference between the second electrode 14 and the fourth electrode 21 adjacent to the second electrode 14. The fourth electrode 21 adjacent to the second electrode 14 indicates one fourth electrode 21 arranged at a position closest to the second electrode 14 among the fourth electrodes 21. Thus, in the exemplary case illustrated in FIG. 9, the fourth electrode 21 adjacent to the second electrode 14 is the fourth electrode 21B.

The fourth potential difference is a potential difference between the fourth electrodes 21 (the fourth electrode 21A, the fourth electrode 21B). In a case in which three or more fourth electrodes 21 are arranged, "between the fourth electrodes 21" means "between the fourth electrodes 21 adjacent to each other".

The fifth potential difference is a potential difference between the third electrode 20 and the fourth electrode 21 adjacent to the third electrode 20. The fourth electrode 21 adjacent to the third electrode 20 indicates one fourth electrode 21 arranged at a position closest to the third electrode 20 among the fourth electrodes 21. Thus, in the exemplary case illustrated in FIG. 9, the fourth electrode 21 adjacent to the third electrode 20 is the fourth electrode 21A.

Such a potential difference can be implemented by adjusting a voltage value of the voltage applied to at least one of the first electrode 12, the third electrode 20, one or a plurality of fourth electrodes 21, and the second electrode 14.

In the present embodiment, the second electrode 14 is grounded. The first electrode 12 is connected to the voltage application unit 22. The third electrode 20 is connected to the voltage application unit 22 via the resistor R1. The fourth electrode 21A is connected to the voltage application unit 22 via the resistor R2 and the resistor R1. The fourth electrode 21B is connected to the voltage application unit 22 via the resistor R3, the resistor R2, and the resistor R1.

Thus, in the detection element 60 according to the present embodiment, the first potential difference, the third potential difference, the fourth potential difference, and the fifth potential difference are adjusted to satisfy the relation described above.

Effect of Detection Element 60

Next, the following describes an effect of the detection element 60.

The radiation L enters the detection element 60, and reaches the organic conversion layer 16. Due to the radiation L that has reached the organic conversion layer 16, the electron-hole pair of the electron e and the hole h is generated in the organic conversion layer 16. Specifically, the electron-hole pair is generated at various positions in the thickness direction Z and the plane direction X of the organic conversion layer 16 in the organic conversion layer 16. The hole h of the generated electron-hole pair moves toward the second electrode 14 side, and the electron e moves toward the first electrode 12 side.

In the present embodiment, the third electrode 20 is arranged in the organic conversion layer 16. Thus, the electric field between the first electrode 12 to which a bias is applied and the third electrode 20 is stronger than the electric field between the second electrode 14 and the third electrode 20 in the organic conversion layer 16.

In the present embodiment, one or a plurality of fourth electrodes 21 are arranged between the third electrode 20 and the second electrode 14 in the organic conversion layer 16. Thus, strength of the electric field in the region between the second electrode 14 and the third electrode 20 in the organic conversion layer 16 is adjusted to be gradually or continuously increased from the second electrode 14 side toward the third electrode 20.

Figure 10:
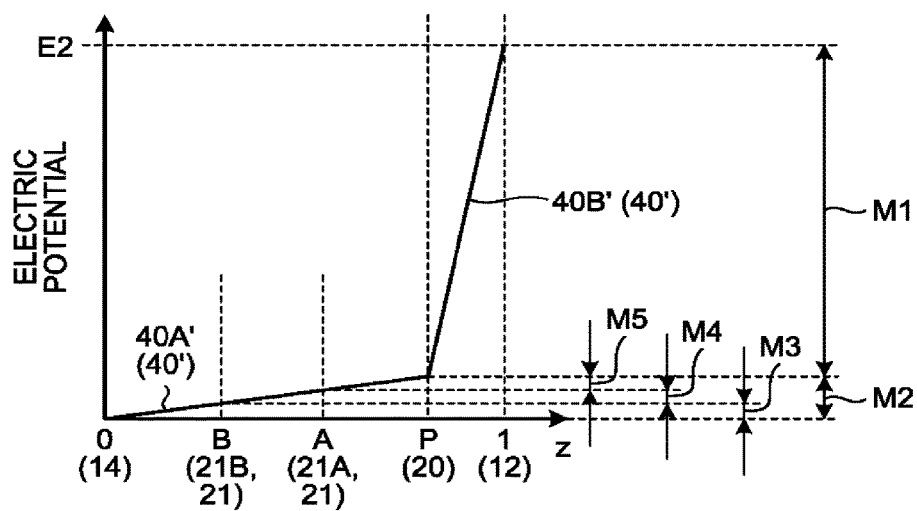
FIG. 10 is a diagram illustrating electric potential of the detection element.

Thus, the electric potential among the first electrode 12, the third electrode 20, the fourth electrode 21 (the fourth electrode 21A, the fourth electrode 21B), and the second electrode 14 becomes electric potential illustrated in FIG. 10.

FIG. 10 is a diagram illustrating an example of the electric potential of the detection element 60.

The end on the second electrode 14 side of the organic conversion layer 16 (that is, the position of the plane of incidence S) is represented as the position in the thickness direction Z, that is, z=0 (also refer to FIG. 9). The end face on the first electrode 12 side of the organic conversion layer 16 (the position of the end face N) is represented as the position in the thickness direction Z, that is, z=1. The position of the third electrode 20 in the thickness direction Z of the organic conversion layer 16 is represented as the position z=P. However, the position z=P represents a relation of 0<P<1. The position of the fourth electrode 21A in the thickness direction Z of the organic conversion layer 16 is represented as the position z=A. The position of the fourth electrode 21B in the thickness direction Z of the organic conversion layer 16 is represented as the position z=B.

As illustrated in FIG. 10, the first potential difference M1 between the first electrode 12 and the third electrode 20 is larger than the second potential difference M2 between the second electrode 14 and the third electrode 20. The first potential difference M1 is also larger than a third potential difference M3, a fourth potential difference M4, and a fifth potential difference M5.

That is, inclination of a line 40B' indicating the electric potential between the third electrode 20 and the first electrode 12 is larger than inclination of a line 40A' indicating the electric potential between the first electrode 12 and the third electrode 20.

One or a plurality of fourth electrodes 21 (the fourth electrode 21A, the fourth electrode 21B) are arranged between the second electrode 14 and the third electrode 20, so that the inclination of the line 40A' indicating the electric potential between the second electrode 14 and the third electrode 20 can be more uniformized.

Thus, as compared with the detection element 10 according to the first embodiment, the detection element 60 according to the present embodiment further prevents the hole h of the electron-hole pair generated in the organic conversion layer 16 from losing energy and disappearing before reaching the second electrode 14.

That is, the detection element 60 according to the present embodiment can further prevent the output signal output from the first electrode 12 from including the position dependency related to the generation position of the electron-hole pair in the thickness direction Z of the organic conversion layer 16.

Thus, in addition to the effect of the first embodiment, the detection element 60 according to the present embodiment can further improve detection sensitivity for the radiation L.

An application range of the detection element 10 and the detection element 60 described in the above embodiments is not limited. For example, the detection element 10 and the detection element 60 can be applied to various devices for detecting the radiation L. Specifically, the detection element 10 and the detection element 60 can be applied to a survey meter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions.

What is claimed is:

1. A detection element comprising:
   a first electrode to which a bias is applied;
   a second electrode;
   an organic conversion layer that is arranged between the first electrode and the second electrode, and is configured to convert energy of a radiation into an electric charge; and
   a third electrode arranged in the organic conversion layer, the third electrode being formed in a sheet-like shape arranged in a direction orthogonal to a thickness direction of the organic conversion layer, wherein
   a first distance between the first electrode and the third electrode is smaller than a second distance between the second electrode and the third electrode, and
   a first potential difference between the first electrode and the third electrode is larger than a second potential difference between the second electrode and the third electrode.

2. The element according to claim 1,
wherein the third electrode has a through hole extending in a thickness direction of the organic conversion layer.

3. The element according to claim 1, wherein the third electrode is formed from a conductive carbon material.

4. The element according to claim 1, further comprising one or more fourth electrodes arranged between the second electrode and the third electrode in the organic conversion layer.

5. The element according to claim 4, wherein the one or more fourth electrodes include a plurality of fourth electrodes, and positions of the plurality of fourth electrodes in the thickness direction of the organic conversion layer are different from each other.

6. The element according to claim 5, wherein the one or more fourth electrodes include a plurality of fourth electrodes, and a first potential difference between the first electrode and the third electrode is larger than a third potential difference between the second electrode and a fourth electrode adjacent to the second electrode, a fourth potential difference between the plurality of fourth electrodes, and a fifth potential difference between the third electrode and a fourth electrode adjacent to the third electrode.

7. A detector comprising:
the detection element according to claim 1;
a voltage application unit configured to apply the bias to the first electrode; and
a detection unit configured to detect an output signal output from the first electrode.

8. The detector according to claim 7,
wherein the third electrode has a through hole extending in a thickness direction of the organic conversion layer.

9. The element according to claim 1, wherein
an organic material used for the organic conversion layer is at least one of a derivative of polyphenylene vinylene or polythiophene-based polymeric material.

10. The element according to claim 1, wherein
the radiation is at least one of a $\beta$-ray, an $\alpha$-ray, or a neutron ray.

11. The element according to claim 4, wherein
the one or more fourth electrodes are formed in a sheet-like shape arranged in a direction orthogonal to a thickness direction of the organic conversion layer.

* * * * *